US012656391B2

(12) United States Patent
Vasant et al.

(10) Patent No.: US 12,656,391 B2
(45) Date of Patent: Jun. 16, 2026

(54) CHARACTERIZING PATH MARGIN MONITORS WITHOUT THE USE OF SCAN CHAINS

(71) Applicant: Synopsys, Inc., Sunnyvale, CA (US)

(72) Inventors: Gulve Rohini Vasant, Bengaluru (IN);
Durga Prasad Bade, Bangalore (IN);
Abhishek Das, Bangalore (IN);
Santosh Kumar, Bangalore (IN)

(73) Assignee: Synopsys, Inc., Sunnyvale, CA (US)

( * ) Notice: Subject to any disclaimer, the term of this patent is extended or adjusted under 35 U.S.C. 154(b) by 307 days.

(21) Appl. No.: 18/512,679

(22) Filed: Nov. 17, 2023

(65) Prior Publication Data

US 2025/0164550 A1 May 22, 2025

(51) Int. Cl.
*G01R 31/28* (2006.01)

(52) U.S. Cl.
CPC ................................ *G01R 31/2884* (2013.01)

(58) Field of Classification Search
CPC ............ G01R 31/2884; G01R 31/3016; G01R 31/2856; G01R 31/31701; G01R 31/31724; G01R 31/31725; G01R 31/31858; G01R 31/3187; G06F 30/333
USPC ..................................... 324/762.01, 537, 500
See application file for complete search history.

(56) References Cited

U.S. PATENT DOCUMENTS

| | | | | |
|---|---|---|---|---|
| 11,016,145 | B1 * | 5/2021 | Lesser .............. | G01R 31/31727 |
| 2008/0065934 | A1 * | 3/2008 | Whetsel ........... | G01R 31/31722 |
| | | | | 714/701 |
| 2018/0026737 | A1 * | 1/2018 | Kucheravy ............. | H04L 1/248 |
| | | | | 375/227 |
| 2020/0166572 | A1 * | 5/2020 | Whetsel ......... | G01R 31/318508 |
| 2021/0191452 | A1 | 6/2021 | Herberholz et al. | |
| 2023/0079000 | A1 * | 3/2023 | Corso Sarmiento ........................ | |
| | | | | G01R 31/318552 |
| | | | | 714/724 |
| 2023/0176120 | A1 * | 6/2023 | Hietala .......... | G01R 31/318538 |
| 2023/0324949 | A1 | 10/2023 | Massoudi | |

FOREIGN PATENT DOCUMENTS

| | | | |
|---|---|---|---|
| EP | | 2006784 A1 | 12/2008 |
| WO | WO 2022/009199 A1 | | 1/2022 |

OTHER PUBLICATIONS

Fuketa, H. et al. "Adaptive performance compensation with in-situ timing error prediction for subthreshold circuits." IEEE Custom Integrated Circuits Conference, Sep. 13-16, 2009, pp. 215-218.
Kandula, K. et al. "Path Margin Monitor for Silicon Lifecycle." 2023 IEEE Women in Technology Conference (WINTECHCON), Sep. 21, 2023, pp. 1-6.
PCT International Search Report and Written Opinion, PCT Application No. PCT/US2024/052855, Jan. 27, 2025, 16 pages.

* cited by examiner

*Primary Examiner* — Giovanni Astacio-Oquendo
(74) *Attorney, Agent, or Firm* — Fenwick & West LLP

(57) ABSTRACT

An integrated circuit device includes scan chains and path margin monitor units (PMUs) on a single die. The scan chains test signal paths in the integrated circuit device. The PMUs include path monitor circuitry and self-test circuitry. The path monitor circuitry monitor delays of signals propagating along the signal paths. The self-test circuitry test the path monitor circuitry and report the test results via a communications path other than the scan chains.

20 Claims, 11 Drawing Sheets

200

| P.Sel | D.Sel | | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| Path.1 | PASS | PASS | PASS | PASS | PASS | PASS | FAIL | FAIL | FAIL | FAIL | FAIL | FAIL | FAIL | FAIL | FAIL |
| Path.2 | PASS | PASS | PASS | PASS | PASS | FAIL | FAIL | FAIL | FAIL | FAIL | FAIL | FAIL | FAIL | FAIL | FAIL |
| Path.3 | PASS | PASS | PASS | PASS | PASS | PASS | PASS | FAIL | FAIL | FAIL | FAIL | FAIL | FAIL | FAIL | FAIL |
| Path.4 | PASS | PASS | PASS | PASS | PASS | PASS | PASS | PASS | FAIL | FAIL | FAIL | FAIL | FAIL | FAIL | FAIL |
| Path.5 | PASS | PASS | PASS | PASS | PASS | FAIL | FAIL | FAIL | FAIL | FAIL | FAIL | FAIL | FAIL | FAIL | FAIL |
| Path.6 | PASS | PASS | PASS | PASS | PASS | PASS | PASS | PASS | FAIL | FAIL | FAIL | FAIL | FAIL | FAIL | FAIL |
| Path.7 | PASS | PASS | PASS | PASS | PASS | PASS | PASS | PASS | PASS | FAIL | FAIL | FAIL | FAIL | FAIL | FAIL |

CHARACTERIZING PATH MARGIN MONITORS WITHOUT THE USE OF SCAN CHAINS

TECHNICAL FIELD

The present disclosure generally relates to a silicon life cycle management (SLM) system. In particular, the present disclosure relates to characterizing a path margin monitor.

BACKGROUND

As technology nodes shrink and the complexity and gate count of devices increase, some methods of characterizing circuits at manufacturing may not be sufficient to optimize performance of such circuits. With the advent of critical mission mode applications like automotive electronics or health monitoring devices, failure avoidance and prediction are increasingly important requirements for the control electronics of such critical mission mode applications.

SUMMARY

In some aspects, an integrated circuit device includes path margin monitor units (PMUs), which include path monitor circuitry and self-test circuitry. The path monitor circuitry monitor delays of signals propagating along signal paths in the integrated circuit device. The self-test circuitry test the path monitor circuitry and report the test results via a communications path other than the scan chains used to test the signal paths in the integrated circuit device.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 3D is a table of delays for different signal paths, in accordance with some embodiments of the present disclosure.

DETAILED DESCRIPTION

Figure 1:
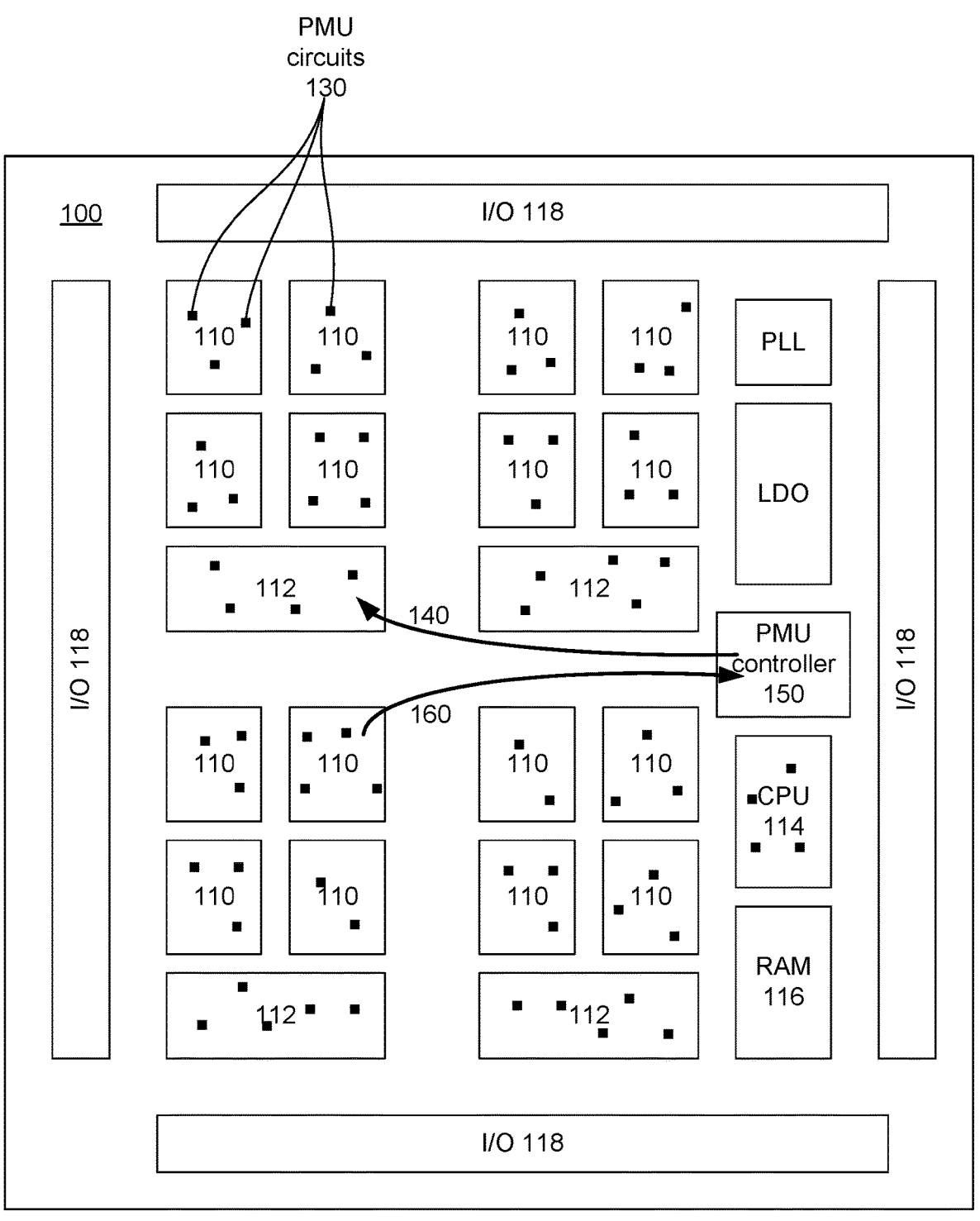
FIG. 1 is a block diagram of an integrated circuit with a built-in path margin monitoring system, in accordance with some embodiments of the present disclosure.

Aspects of the present disclosure relate to characterizing path margin monitors without the use of scan chains. In digital circuits, signals propagate between sequential circuits, such as flip flops and registers, according to timing determined by clocks. In order for digital circuits to function properly, these signals must arrive at the next sequential circuit at least a certain amount of time before the relevant clock signal. The difference between when the signal arrives and the latest time when it could arrive is referred to as the timing margin or path margin or simply margin.

During the design of the integrated circuit, the timing of the circuit is simulated to ensure that there is sufficient margin (e.g., more than a minimum threshold margin) along the different signal paths in the integrated circuit. However, the actual margins in a fabricated chip may differ from the simulations, and the margins may change as a function of temperature and voltage. Moreover, the margins may also change over time as the chip ages. As a result, it is beneficial to have the ability to characterize and monitor actual margins for different signal paths in an operating chip.

Path margin monitor units (PMUs) may be distributed throughout the integrated circuit. PMUs are circuits that measure delay along different signal paths in the integrated circuit. Since they are part of the circuitry in the integrated circuit, it is useful to be able to test that the PMUs are operating as desired and do not exhibit manufacturing or other defects.

Scan chains are one way to test circuitry in an integrated circuit. A scan chain provides access to the interior of an integrated circuit. This allows the values of internal circuits to be set via the scan chain and allows the values of internal circuits to be read out via the scan chain. In this way, a test pattern may be applied at some interior point within the chip, and the corresponding response at another interior point may be read out. This simplifies testing because more signal values and signal paths are accessible. In addition, multiple test points may be connected in series to form the scan chain. This allows multiple signal paths to be tested in parallel. Automatic test pattern generation (ATPG) is the automated process of generating the test patterns, and the test patterns for different circuits may be compressed as part of this process.

Scan chains may be used to test PMUs. However, this has several drawbacks. First, including the PMU testing within the scan chain architecture means that PMU testing is integrated with the testing of other circuits in the scan chain architecture. However, because PMUs monitor conditions on the circuit whereas other circuits implement the actual functionality of the circuit, it may be desirable to test the PMU system separately or at different times than the functional circuitry on the device. Furthermore, to be included in the scan chain architecture, the PMU system must be inserted into the design early enough to be included in the scan chains. However, in standard design flows, the monitoring function and PMUs may be added later in the design phase. The designer may design the functional circuitry and insert the corresponding scan chains first, and then insert the PMUs later. In addition, later changes in the PMUs would also require updates to the scan chain architecture.

In some aspects, PMUs include path monitor circuitry and self-test circuitry. When a PMU is operating in a monitor mode, the path monitor circuitry monitors delays of signals propagating along signal paths in the integrated circuit. When a PMU is operating in a self-test mode, the self-test circuitry tests the path monitor circuitry. The results of the self-test mode are reported through a communications path other than the scan chains. For example, the PMUs may be connected into a chain in accordance with IEEE 1687. The IEEE1687 interface is an access network standard to read internal chip data through a serial network. To accommodate this self-test approach, some hardware changes are made to the PMUs and some changes in the test patterns are also made, compared to PMUs that are connected as part of scan chains. Examples of these changes are described in more detail below.

Technical advantages of the present disclosure include, but are not limited to, the following. Separating the PMU system from the scan chain architecture allows it to be designed and operated separately from the scan chains. PMUs may be inserted and the PMU system may be changed later in the design phase, after the scan chains have already been designed and inserted. In addition, the PMUs may be tested and operated separately from the scan chain architecture used to test functional circuitry.

As an example, FIG. 1 is a block diagram of an integrated circuit with a built-in path margin monitoring system, in accordance with some embodiments of the present disclosure. In this particular example, the integrated circuit 100 is partitioned into four sectors, each with four processor cores 110 and associated logic 112. The integrated circuit also includes a master central processing unit (CPU) 114, on-chip memory 116, and input/output (I/O) functions 118 such as serializer/deserializer (Serdes), Peripheral Component Interconnect Express (PCIe), High-Definition Multimedia Interface (HDMI), and double data rate (DDR).

The PMU system includes instances of PMU circuits, shown as black squares some of which are labelled 130, and a PMU controller 150. Instances of the PMU circuits 130 are distributed throughout the integrated circuit in order to monitor path margin at different points across the integrated circuit. In FIG. 1, for convenience, PMU circuits 130 are not shown in every block. In alternate embodiments, PMU circuits 130 may be inserted in other blocks as well. The PMU circuits 130 are integrated alongside the signal paths being monitored. As a result, the integrated circuit may be monitored in real-time.

The PMU controller 150 is also integrated on-chip. In FIG. 1, it is shown as one block but it may be implemented in a distributed fashion. The PMU controller 150 communicates with the PMU circuits 130. The controller 150 sends control signals 140 to the PMU circuits 130. For example, the PMU system may have different modes of operation, including self-test mode and monitor mode. In self-test mode, the PMU system performs tests on the PMU circuits themselves to ensure that they are operating correctly. In monitor mode, the PMU system measures delays along signal paths, thus providing real-time information about the chip operation. The PMU controller 150 sends control signals 140 to the PMU circuits to configure them for the current mode of operation.

The PMU controller 150 also receives data 160 from the PMU circuits. In monitor mode, this data 160 may be indicative of the delays of the monitored signals. The controller 150 may analyze these signals, thus providing a path margin monitoring capability across the integrated circuit. For example, it may combine the data from the individual PMU circuits to provide a chip-level model of the path margin.

In self-test mode, this data 160 may indicate which PMU circuits 130 are defective. The data 160 is communicated via communications paths other than through the scan chains used to test the functional circuitry. For example, the PMU circuits 130 may be connected into chains according to IEEE 1687.

Because both the PMU circuits 130 and the PMU controller 150 are on-chip, the PMU system may provide real-time monitoring of path margins across the integrated circuit. The data produced by the PMU system may be consumed on-chip. For example, path margin is affected by operating voltage, temperature and clock speed. The path margin measurements may be used as feedback to other circuitry on the chip, which may alter their operation accordingly. For example, if path margin starts to degrade in a section of the chip, the clock speed may be decreased, or thermal heat accumulation may be decreased by increasing cooling or reducing power consumption. On the other hand, if there is excess path margin in a section of the chip, the clock speed may be increased, or thermal heat accumulation may be allowed to increase by decreasing cooling or increasing power consumption. The collected PMU data may be used to explore operational limits such as clock speed and voltage.

The monitoring data produced by the PMU system may also be used to monitor changes in path margin over the lifetime of the chip. Current path margin data may be compared to historical data to identify trends and predict future problems. The monitoring data may also be analyzed off-chip. For example, more complex analysis may require computational resources that are not available on-chip, and storage of PMU data captured over long periods of time may require more space than is available on-chip. Analysis may also combine the PMU data with other data that is not available on-chip, for example external measurements of temperature or power consumption. As another example, monitoring data from multiple chips may be analyzed together to provide a view of a board, a rack-mounted device or other environment that is larger than just a single chip.

Figure 2A:
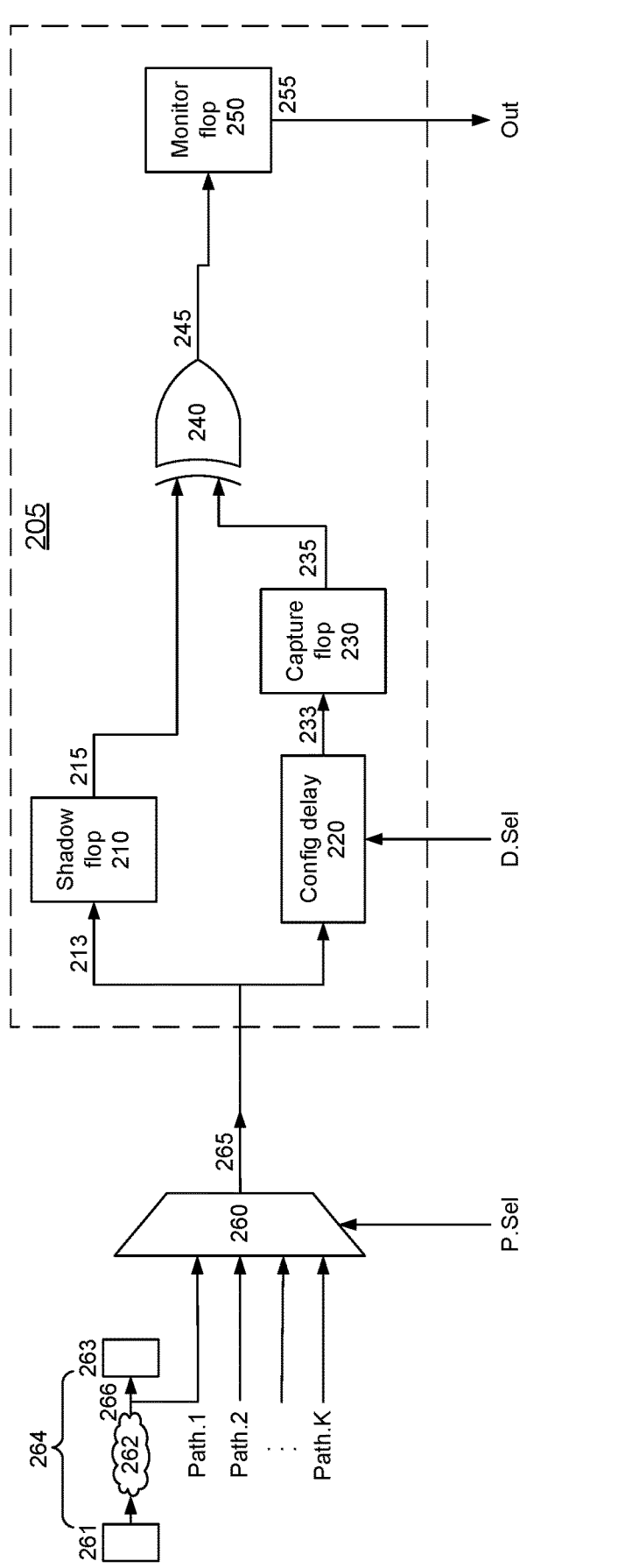
FIG. 2A is a block diagram of a path margin monitoring unit (PMU), in accordance with some embodiments of the present disclosure.
Figure 2B:
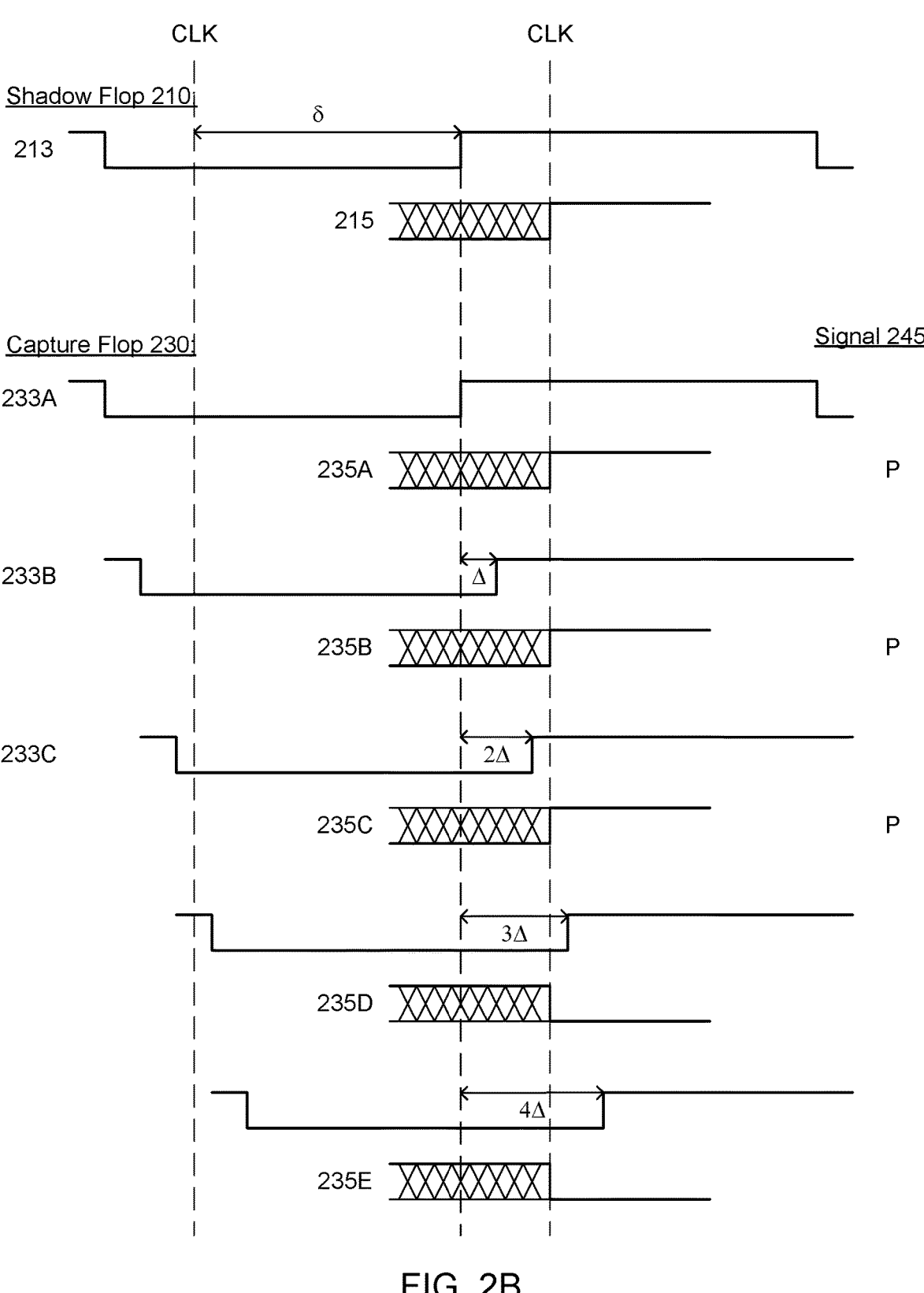
FIG. 2B is a timing diagram showing operation of the path monitor circuitry of FIG. 2A.

FIG. 2A is a block diagram of a path margin monitoring unit (PMU) 200, in accordance with some embodiments of the present disclosure. This block diagram illustrates operation of the path monitor circuitry 205 within the PMU during monitor mode. FIG. 2B is a timing diagram showing operation of the path monitor circuitry 205. FIG. 2A shows a signal path 264 that is monitored by PMU 200. The signal path 264 originates at sequential circuit 261, propagates through combinational circuitry 262 and terminates at sequential circuit 263. In this example, the sequential circuits 261, 263 are flip flops (also referred to as flops herein), and the originating flop 261 and terminal flop 263 are both clocked by a common clock signal. This example shows one originating flop 261 for clarity, but there may be multiple originating flops to produce the functional signal received by the terminal flop 263.

The signal path 264 is tapped at point 266 and the PMU 200 monitors the delay of the signal at this point. This signal is one of the inputs to multiplexer 260 and is labeled Path.1 in FIG. 2A. P.Sel (path select) is the select signal for the multiplexer, which may be provided by the PMU controller. When the multiplexer 260 is set to select Path.1, the monitored signal 266 is selected and routed to the multiplexer output 265. The path monitor circuitry 205 monitors the delay of this signal. The path monitor circuitry 205 receives the signals propagating along the Path.1 being monitored and also receives the corresponding clock signal. The monitored signal is compared to delayed versions of the signal to determine the amount of delay that will result in a mismatch between the monitored signal and the respective delayed version of the signal. The amount of delay is a measure of the path margin for that signal path. The path monitor circuitry 205 outputs a monitor signal 255 that is indicative of the path margin and/or delay along the signal path 264.

The path monitor circuitry 205 includes two flip flops 210, 230, both of which are clocked by the same clock signal as flip flop 263. For convenience, they are referred to as the shadow flop 210 and the capture flop 230. Shadow flop 210 receives the monitored signal 265 without additional delay. Capture flop 230 receives a delayed version of the monitored signal 265. Here, the monitored signal 265 is input to a configurable delay circuit 220, which adds an adjustable amount of delay. The delay select signal D.Sel determines the amount of delay, which in this example is multiples of some base delay Δ. The D.Sel signal may be determined by the PMU controller, either directly or indirectly. For example, the controller may set the operating mode of the PMU 200, which then determines the sequence of P.Sel values applied over time. Alternatively, the controller may send P.Sel signals directly to the PMU.

A comparator 240 (e.g., XOR or XNOR) compares the reference version 215 from the shadow flop 210 and the delayed version 235 from the capture flop 230. The output is indicated as either a pass (P) if the two versions 215 and 235 are the same, or a fail (F) if the two versions 215 and 235 are different. The monitor flop 250 captures the P or F, using the same clock signal as the other flops.

FIG. 2B is a timing diagram illustrating this operation. In this example, the signal path 264 is clocked by clock signal CLK. The monitored signal 265 is toggling between 0 and 1 with some propagation delay δ. The top row of FIG. 2B shows the input 213 to the shadow flop 210, which is just the toggle signal with delay δ. FIG. 2B shows a dashed line at the time point when the CLK signal causes the flops 210, 230 to capture their input values (e.g., at the rising edge of the clock). Shadow flop 210 receives signal 213 and captures a logic 1. It outputs signal 215, which is a reference version of the signal being monitored. For clarity, FIG. 2B considers the value of output signal 215 only after the second CLK trigger.

Below the timing diagrams for the shadow flop 210 are shown five delayed versions 233A-E input to the capture flop 230, with delays ranging from 0 for 235A to 4Δ for 235E. Here, Δ is the base delay of the configurable delay circuit 220. The base delay depends on the technology node. For example, at more advanced nodes, the base delay may be about 15 ps. The timing of the flops 210, 230 is determined by the CLK signal. Version 233A has zero delay and capture flop 230 would also capture a logic 1 as output 235A, if the configurable delay were set to this delay. Versions 233B,C have increasing delay but the logic 1 value still arrives in sufficient time to be captured by flop 230, resulting in output signals 235B,C. In versions 233D,E, the delay exceeds the available path margin so capture flop 230 would capture the next bit instead, which is the output signal 235D,E of logic 0.

The corresponding output 245 of the comparator 240 is shown in the right column. P stands for pass, meaning that the signal path has sufficient path margin to continue to operate correctly even with the additional time delay. F stands for fail, meaning that the path margin is not sufficient to accommodate the additional delay. In this example, the comparator 240 is an XOR gate. The XOR gate produces a logic 0 when the two inputs are the same, which in this case is a pass P. An XOR output of logic 1 means that the two inputs are different, which is a fail F. Versions 233A-C pass and versions 233D-E fail. From this, it can be deduced that the actual path margin is between 2Δ and 3Δ.

In the example circuit shown in FIG. 2A, not all of the delayed versions 233A-E are compared on every clock cycle. Rather, on each clock cycle, only one delayed version is produced by the configurable delay 220. Other delayed versions are compared on other clock cycles. In an alternative version, multiple values could be compared on a single clock cycle if additional flops were added to capture the different versions. However, this adds area to the PMU, which would be multiplied by the number of PMUs on the integrated circuit.

The explanation thus far concerns the monitoring of a single signal path 264 by a single PMU. Multiplexer 260 allows multiple signal paths to be monitored by a single PMU. In FIG. 2A, there are multiple signal paths Path.1 to Path.K. The select input P.Sel to multiplexer 260 selects which signal is connected to the path monitor circuitry 205.

Figure 3A:
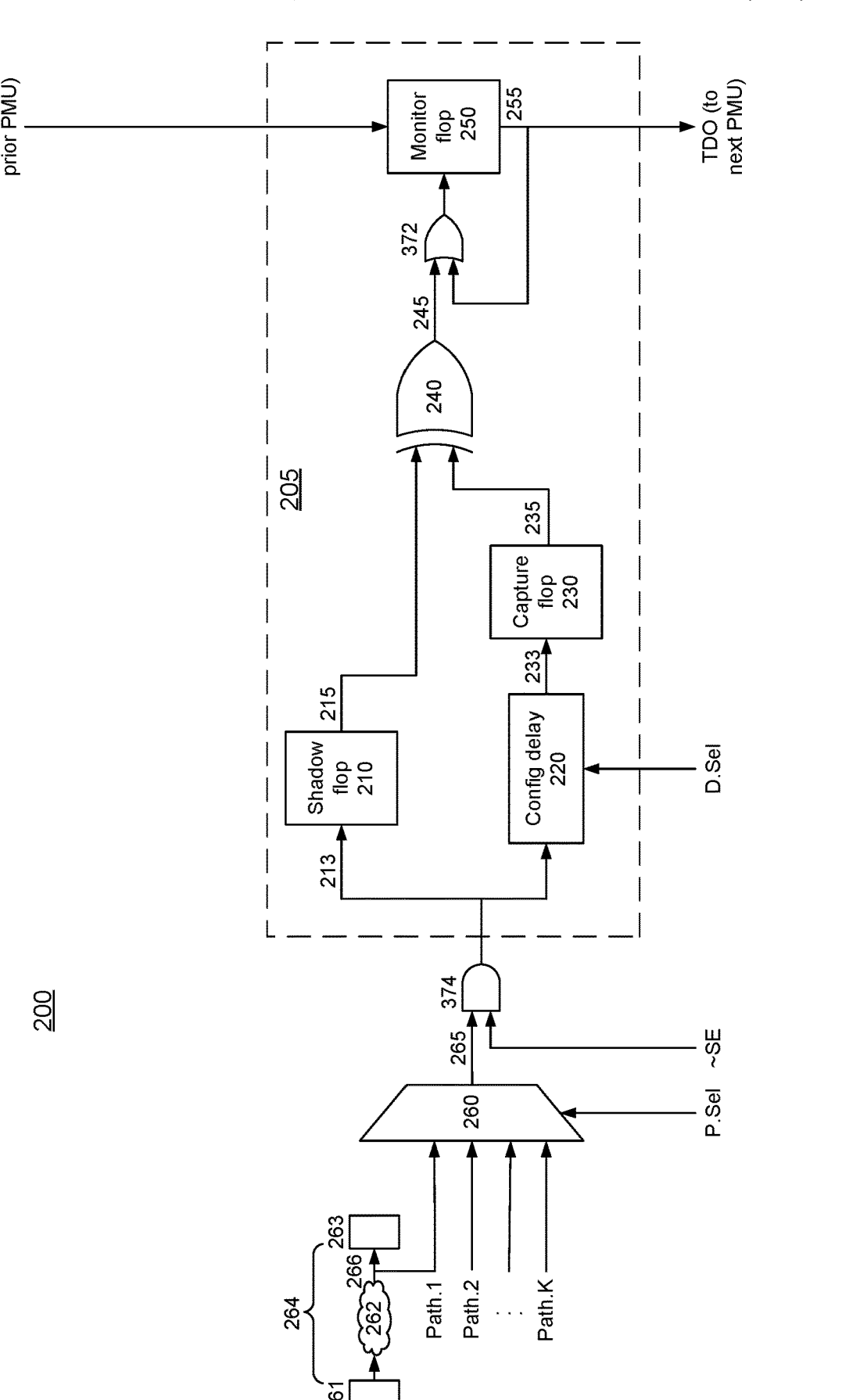
FIG. 3A is a block diagram of a PMU operating in monitor mode, in accordance with some embodiments of the present disclosure.
Figure 3B:
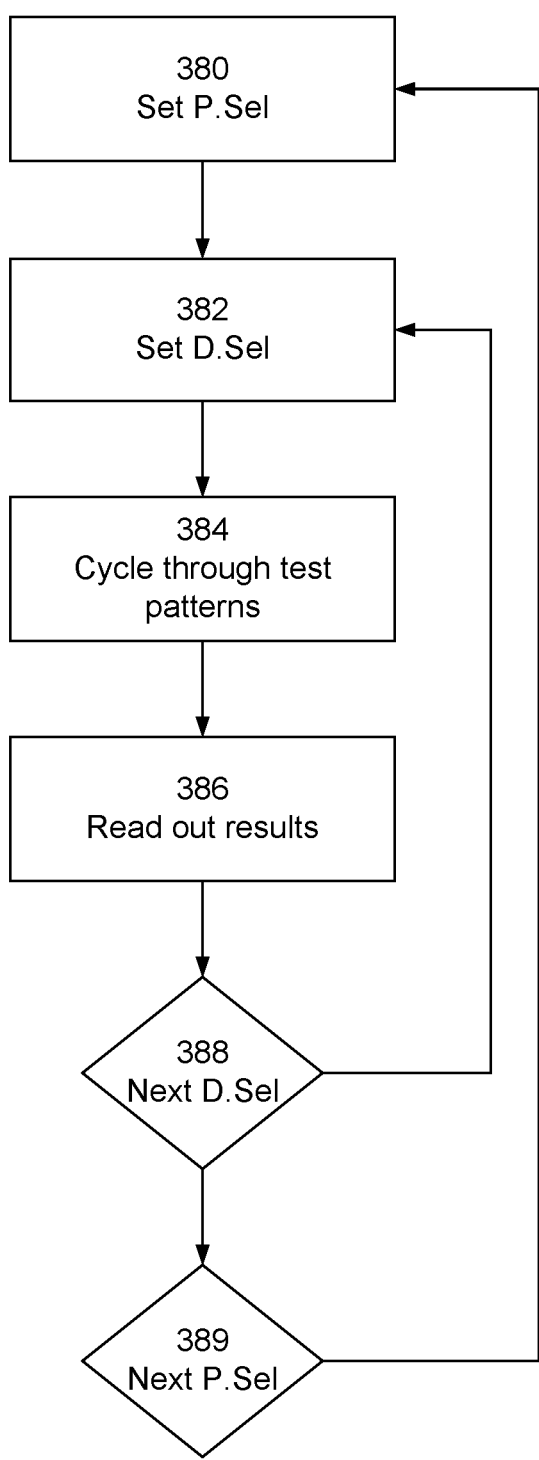
FIG. 3B is a flow diagram of a PMU operating in monitor mode, in accordance with some embodiments of the present disclosure.

Now consider a situation where many PMUs are operating concurrently to monitor different signal paths, as shown in FIGS. 3A and 3B. FIG. 3A is the PMU of FIG. 2A, but with additional circuitry to enable the parallel monitoring. Specifically, the monitor flops 250 of different PMUs are connected in series into a chain through the TDI and TDO ports. TDI/TDO are the serial input/output of the IEEE 1687 interface. TDI is the input connection to this PMU from the prior PMU in the chain, and TDO is the output connection from this PMU to the next PMU in the chain. FIG. 3A also includes additional AND gate 374 with invert of scan enable (~SE) as input, and OR gate 372 with loop back from the output of monitor flop 250. FIG. 3B is a flow diagram of the parallel monitoring.

Assume that there are N PMUs connected in a chain. The output TDO of this PMU is connected to the input TDI of the next PMU in the chain, and vice versa. In this way, the contents of the monitor flops 250 in the chain may be read out through the chain. If there are N PMUs in the chain, each PMU can monitor K possible paths via P.Sel, and each PMU can be set for L different delays via D.Sel. Then it will take N×K×L readouts of the chain to monitor all possible signal paths if each possible combination of (PMU, P.Sel, D.Sel) is separately tested and the result P/F is separately read out.

However, because they are separate circuits and monitor separate signal paths, the N PMUs could operate in parallel. For example, all N PMUs might monitor a path specified by P.Sel, for a delay specified by D.Sel, and cycling through a number of test patterns used to exercise the path. At the end of this, the P/F's stored in all of the monitor flops 250 may be read out through the chain. However, the output 255 of monitor flop 250 follows the output 245 of the XOR gate 240. The output 255 will rise to logic 1 (fail) when output 245 rises to logic 1, and will fall to logic 0 (pass) when output 245 falls to logic 0. If the monitor flop 250 is not read out on every cycle, then an F may be missed. If the output 255 produces F on a cycle that is not read, for example for an earlier test pattern, and then changes to P on the read cycle for a later test pattern, the F will be missed. In one embodiment, the output of monitor flop 250 is fed back to an input of OR gate 372, and the output of OR gate 372 is input to the monitor flop 250, as shown in FIG. 3A. This loop of feeding back the output of monitor flop 250 back to OR gate 372 functions to freeze any fail (logic 1). If the output 255 ever reaches logic 1, then it will stay at logic 1.

All PMUs cycle through the different test patterns. If there is a failure for any test pattern, the monitor flop 250 will output an F during readout of the chain. When the next set combination of path and delay is considered, the monitor flops 250 are first reset. This is accomplished by the addition of AND gate 374 and scan enable SE. SE is the signal that controls the scan chains that provide test patterns to the signal paths 264. When SE is logic 1, then test patterns are shifted into the signal paths 264. When SE is logic 0, the signal paths 264 operate in response to the loaded test patterns. This is when signal monitoring occurs. In FIG. 3A, when SE is logic 1, then ~SE (not SE) is logic 0 and the logic 0 propagates through to the inputs of the XOR 240, which means output 245 is logic 0. This resets the shadow and capture flops 210, 230 so that the value of the monitor flop 250 is not affected during shift.

Once the test patterns have been loaded for the new signal path, it is ready to be monitored. Scan enable SE is logic 0 and ~SE is logic 1, which effectively makes the AND gate 374 a pass-through. Signal 265 will pass through the AND gate 374. The path monitor circuitry 205 receives as signal 265, the signal from the new signal path that is being monitored and operates as described previously.

FIG. 3B is a flow diagram of this process. At 380, the selection of the signal paths (P.Sel) is set for the PMUs in the chain. Each PMU will then be monitoring the selected signal path. At 382, the selection of the delay (D.Sel) is also set for the PMUs in the chain. At 384, the different test patterns are shifted in and applied to the signal paths. As a result of the freeze loop, the monitor flops 250 capture F if a failure is encountered for any test pattern. At 386, the P/F stored in the monitor flops 250 are read out. This is then repeated for other delays and other signal paths. In FIG. 3B, this is shown as two loops, an inner loop 388 that cycles through different delays for a given Path.k, and an outer loop 389 that cycles through different Path.k.

Figure 3C:
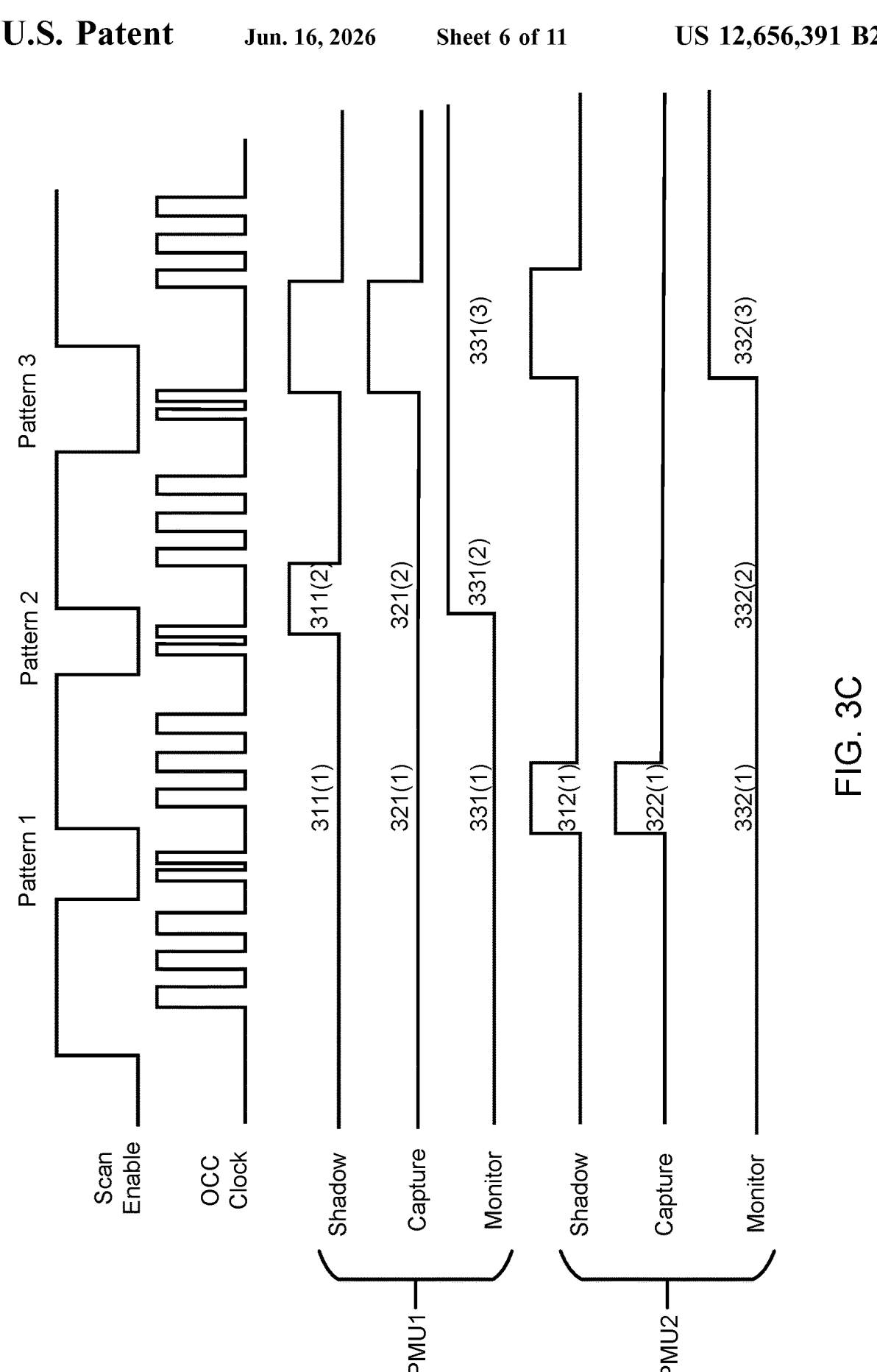
FIG. 3C are timing diagrams showing operation of multiple PMUs in response to multiple test patterns, in accordance with some embodiments of the present disclosure.

An example of this is shown in FIGS. 3C-3D. FIG. 3C shows timing diagrams for cycling through test patterns at 384 of FIG. 3B. There is no looping 380 or 382 shown in FIG. 3C. FIG. 3C shows the scan enable SE and clock. FIG. 3C also shows the outputs of the shadow flop, capture flop and monitor flop for two PMUs: PMU1 and PMU2. When scan enable SE is logic 1, a test pattern is shifted in for testing the signal paths for the PMUs. Not all test patterns need be applicable to all PMUs. When scan enable SE is logic 0, the signal paths are operated and produce results in response to the test patterns.

For test pattern 1, the outputs of the shadow flop 311(1), 312(1) and capture flop 321(1), 322(2) are the same for PMU1 and for PMU2, so the test is passed as indicated by the monitor flops 331(1), 332(2) storing logic 0 for both PMUs. For test pattern 2, PMU1 fails because the shadow flop 311(2) and capture flop 321(2) have different logic levels. The value of the PMU1 monitor flop 331(2) records the fail as a logic 1. PMU2 passes pattern 2, so its monitor flop 332(2) remains at logic 0. For pattern 3, PMU1 passes but the monitor flop 331(3) remains as a fail (logic 1) due to the feedback loop shown in FIG. 3A. This is the desired result. Otherwise, the fail of pattern 2 will be lost. PMU2 fails pattern 3, so its monitor flop 332(3) records logic 1 (fail). The monitor flops for both PMU1 and PMU2 will remain in the fail state (logic 1) for any subsequent test patterns asserted for this iteration of P.Sel and D.Sel. At the end of this sequence of test patterns, the output responses of the monitor flops are serially scanned out through the 1687 interface (at 386 of FIG. 3B).

This is repeated for different values of P.Sel and D.Sel through loops 380, 382 of FIG. 3B. The end result is a table as shown in FIG. 3D. This table shows the Pass/Fail result for each P.Sel and each D.Sel. Each row is a different signal path (P.Sel). Each column is a different delay (D.Sel). The path margin for each signal path may be determined from this table. For example, Path.1 (P.Sel=1) has a path margin equal to the delay that corresponds to D.Sel=6.

Figure 4:
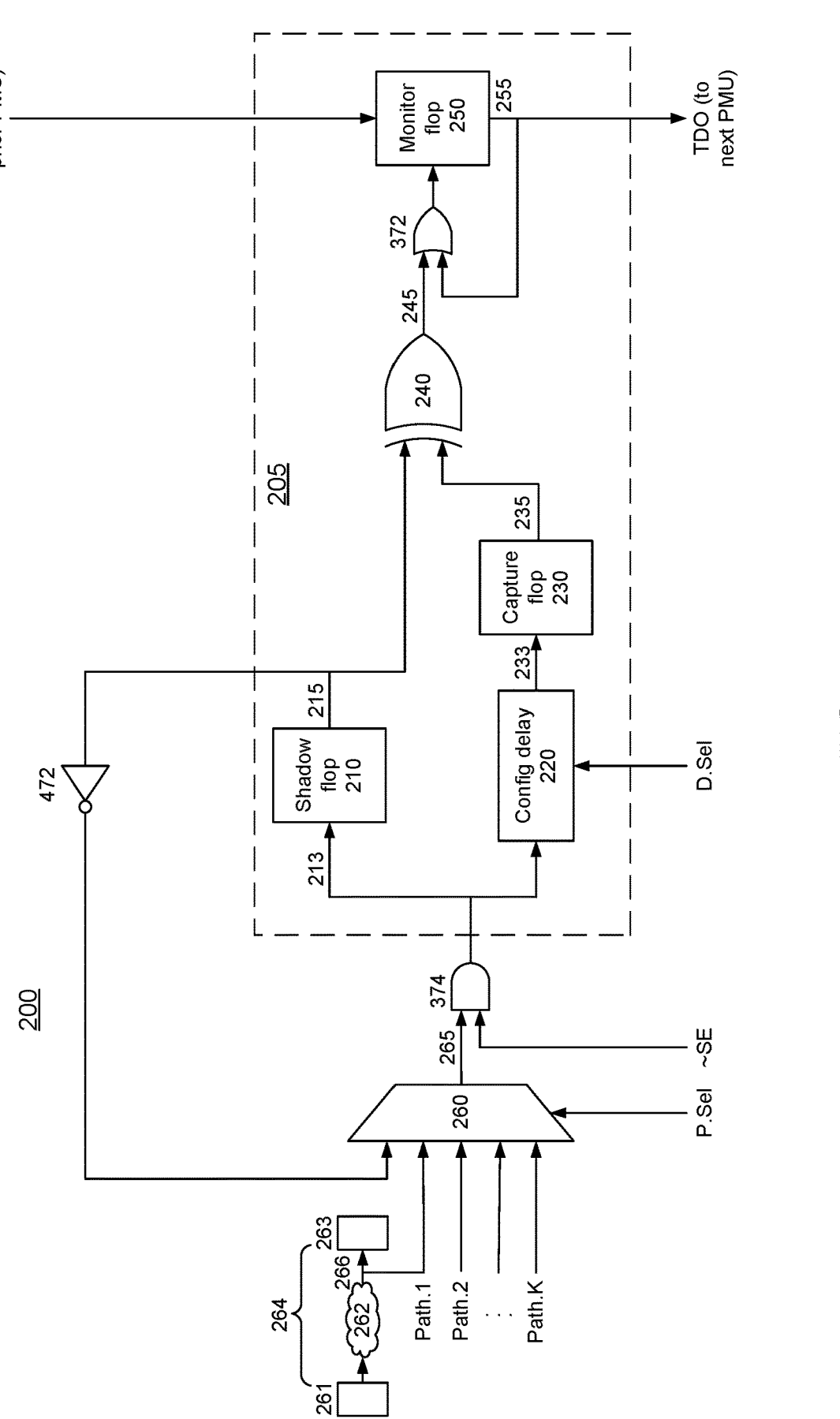
FIG. 4 is a block diagram of a PMU with self-test circuitry for testing circuitry internal to path monitor circuitry, in accordance with some embodiments of the present disclosure.
Figure 5:
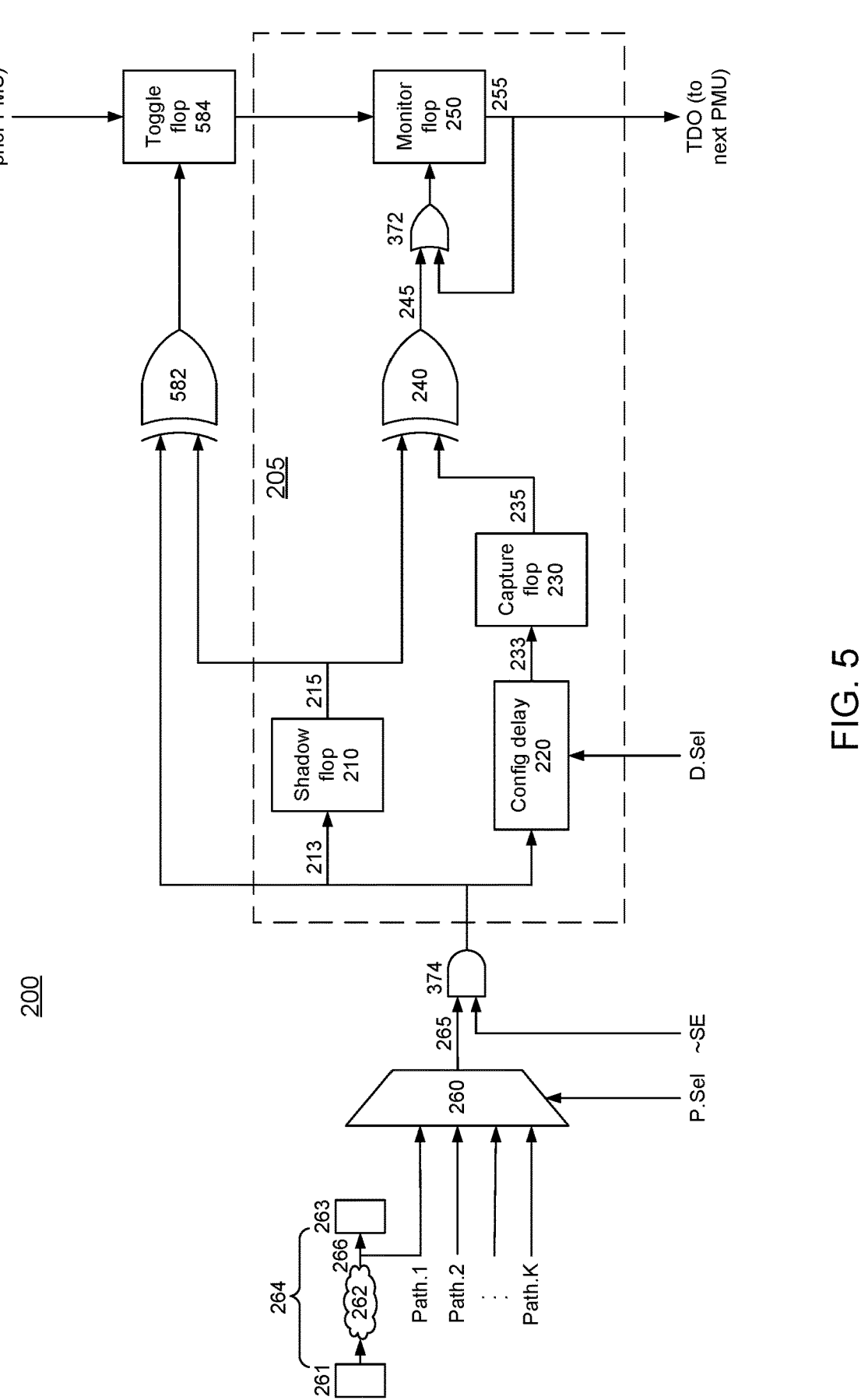
FIG. 5 is a block diagram of a PMU with self-test circuitry for testing circuitry external to path monitor circuitry, in accordance with some embodiments of the present disclosure.

FIGS. 4-5 illustrate the self-test mode for PMUs. FIG. 4 shows the PMU of FIG. 3A, but with additional self-test circuitry for testing circuitry within the path monitor circuitry 205. The self-test circuitry includes a feedback loop from the output of the shadow flop 210 to the input of the shadow flop. This loop includes an inverter 472, which is connected between the shadow flop 210 and an input to the multiplexer 260. When the loop is selected by the multiplexer 260, the loop operates as an oscillator to generate and apply a toggle signal to the path monitor circuitry 205. The toggle signal has close to zero propagation delay since it is generated internally within the PMU. As such, the path monitor circuitry 205 should generate a pass P (logic 0) for all values of delay within the configurable delay 220. If there is a fault in one of the delay branches, that value may be stuck rather than toggling. This will result in a fail F when that branch is active. In the self-test mode, the configurable delay circuit 220 tests all of the signal paths within the configurable delay circuit. The freeze loop circuitry 255-372 preserves the occurrence of any fail F.

FIG. 5 shows the PMU of FIG. 3A, but with additional self-test circuitry for testing circuitry outside the path monitor circuitry 205. These are primarily the different Path.k through the multiplexer 260. The additional test circuitry includes a comparator 582 and corresponding flop 584, referred to as a toggle flop. Using Path.1 as an example, a toggle signal is produced on Path.1, for example by using scan chains to load the corresponding test pattern onto signal path 264. The comparator 582 compares the input 213 and output 215 of the shadow flop 210. Since the input is toggling, the input and output should always be complements of each other, and the XOR gate 582 should produce a logic 1, which is captured by the toggle flop 584. However, if there is a fault along Path.1 to the shadow flop, then the input 213 and output 215 may be the same, and the XOR gate 582 will produce a logic 0. The self-test may cycle through the different Path.k to test the different circuitry within the PMU.

The toggle flop 584 is part of the chain with monitor flop 250. The self-test results stored in the two flops 584, 250 may be read out through the chain.

Figure 6:
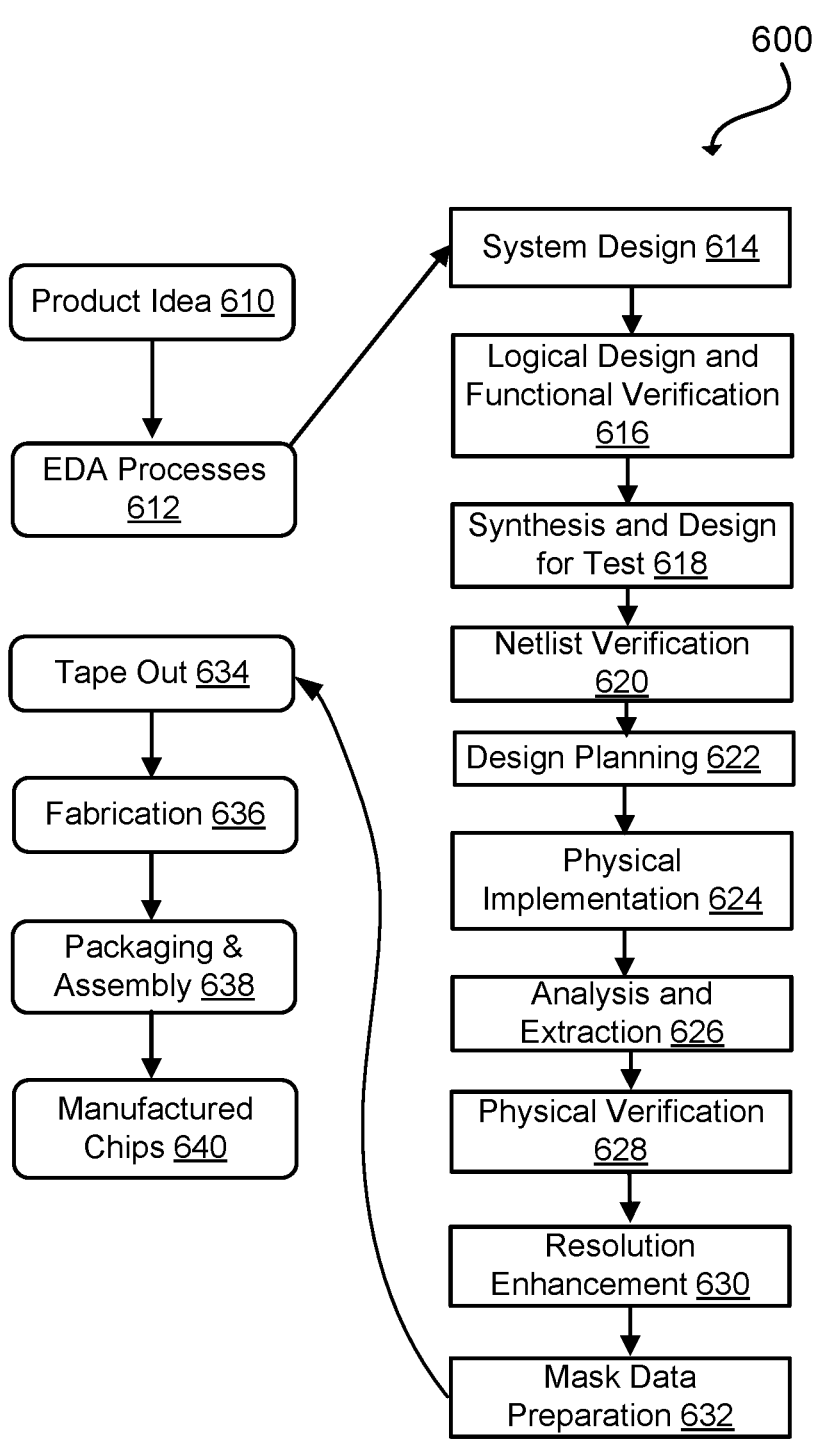
FIG. 6 depicts a flowchart of various processes used during the design and manufacture of an integrated circuit in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 6. The processes described by be enabled by EDA products (or EDA systems).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
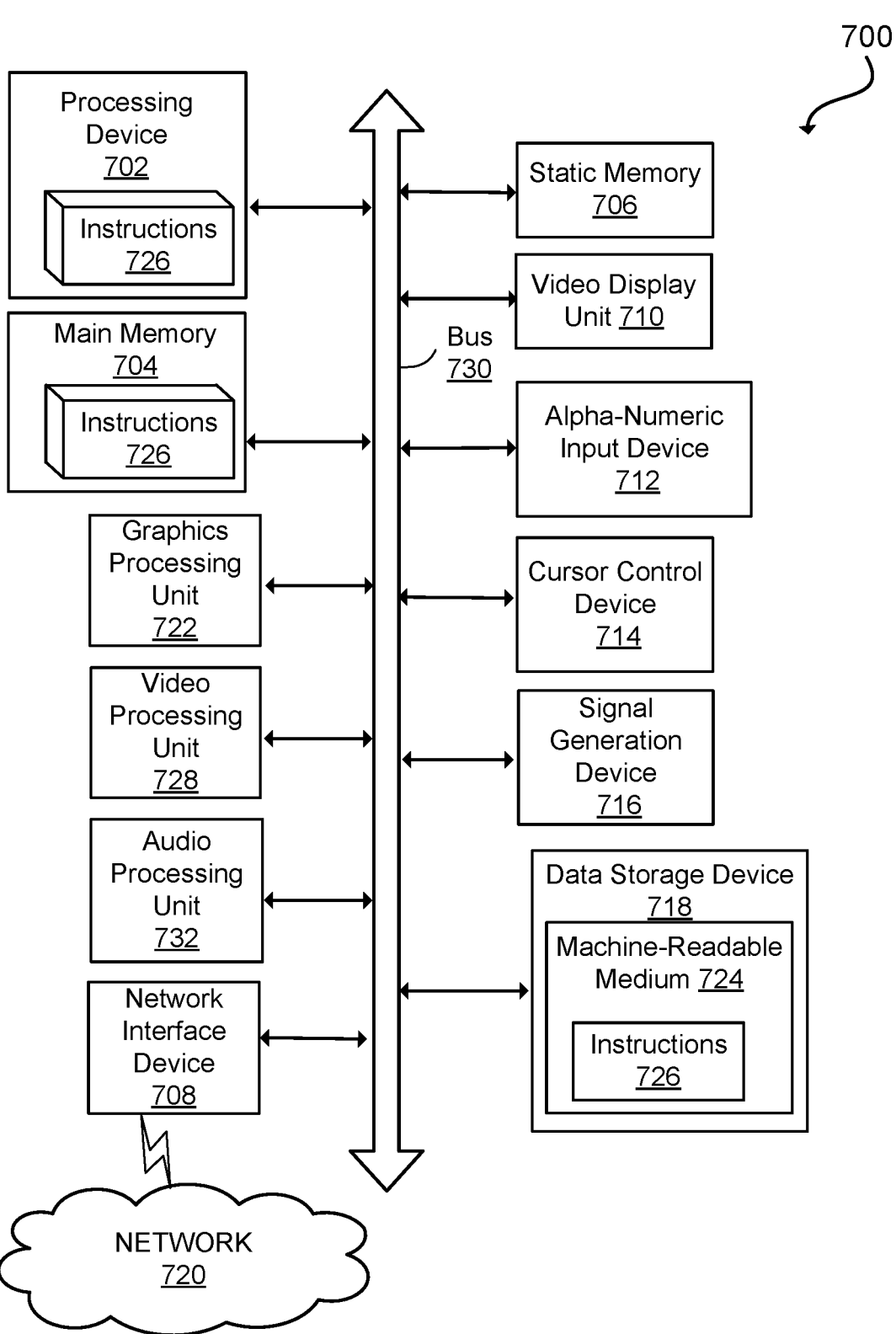
FIG. 7 depicts a diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An integrated circuit device comprising a plurality of path margin monitor units (PMUs) comprising:
    path monitor circuitry that monitor delays of signals propagating along signal paths in the integrated circuit device; and self-test circuitry that test the path monitor circuitry and report test results via a communications path other than scan chains used to test the signal paths in the integrated circuit device.

2. The integrated circuit device of claim 1, wherein the path monitor circuitry comprises:

a shadow flop that captures a reference version of the monitored signal;

a delay circuit connected to a capture flop, wherein the capture flop captures a delayed version of the monitored signal; and a first comparator that compares the reference version and the delayed version of the monitored signal.

3. The integrated circuit device of claim 2, wherein testing the path monitor circuitry tests all signal paths in the delay circuit.

4. The integrated circuit device of claim 2, wherein the path monitor circuitry further comprises:

a monitor flop that captures a result of the comparison; and freeze loop circuitry that freezes a status of the monitor flop once the comparison indicates that the reference version and the delayed version of the monitored signal are different.

5. The integrated circuit device of claim 1, wherein the path monitor circuitry comprises a shadow flop that captures a reference version of the monitored signal, and the self-test circuitry includes a feedback loop from an output of the shadow flop to an input of the shadow flop, the feedback loop includes an inverter, and the feedback loop operates to generate and apply a toggle signal to the path monitor circuitry.

6. The integrated circuit device of claim 1, wherein the path monitor circuitry comprises a shadow flop that captures a reference version of the monitored signal, and the self-test circuitry further includes a second comparator that compares an input of the shadow flop and an output of the shadow flop.

7. The integrated circuit device of claim 1, wherein the PMU further comprises:

a multiplexer that multiplexes multiple signal paths to the path monitor circuitry, and the self-test circuitry is configured to test the PMU in response to toggle signals propagating along the monitored signal paths.

8. The integrated circuit device of claim 1, wherein the self-test circuitry is configured to generate and apply a toggle signal to the path monitor circuitry, in order to test the path monitor circuitry.

9. The integrated circuit device of claim 1, wherein the self-test circuitry is configured to test the PMU in response to a toggle signal propagating along the monitored signal path.

10. The integrated circuit device of claim 1, further comprising:

a controller that controls the PMUs; wherein a first PMU of the PMUs is operable in a monitor mode that uses the path monitor circuitry and in a self-test mode that uses the self-test circuitry, and the controller configures the mode of operation for the first PMU.

11. A method comprising:

sending control signals to a plurality of path margin monitor units (PMUs) circuits to control operation of the PMUs; wherein the PMUs are operable in a monitor mode and in a self-test mode, in the monitor mode the PMUs monitor delays of signals propagating along signal paths in an integrated circuit device, and in the self-test mode the PMUs run self tests; and receiving monitor results of the monitor mode and receiving test results from the self-test mode, wherein the monitor results and test results are received via a communications path other than scan chains used to test the signal paths on the integrated circuit device.

12. The method of claim 11, wherein the communications path comprises a chain of PMUs.

13. The method of claim 12, wherein; in the self-test mode all PMUs in the chain concurrently run self tests, and receiving test results comprises receiving test results for all PMUs in the chain.

14. The method of claim 12, wherein; in the monitor mode all PMUs in the chain concurrently monitor delays, and receiving monitor results comprises receiving monitor results for all PMUs in the chain.

15. The method of claim 12, wherein the PMUs are connected into the chain according to IEEE 1687.

16. The method of claim 12, further comprising, for the monitor mode:

using the scan chains to shift in test patterns to the signal paths; and sending control signals to configure the PMUs to monitor the delays in response to the test patterns.

17. The method of claim 12, wherein monitoring delays of signals comprises:

cycling through different test patterns to determine whether the signals fail path margin requirements; and reporting a failure if the signals fail for any of the different test patterns.

18. A non-transitory computer readable medium comprising stored instructions, which when executed by a processing device, cause the processing device to:

insert a plurality of path margin monitor units (PMUs) into a design of an integrated circuit, wherein the PMUs are operable in a monitor mode that monitor delays of signals propagating along signal paths in the integrated circuit and in a self-test mode that tests the PMUs; and insert a communications path for the PMUs to report results of the self-test mode, wherein the communications path is separate from scan chains used to test the signal paths in the integrated circuit.

19. The non-transitory computer readable medium of claim 18 wherein the PMUs and communications path are inserted separately from the scan chains.

20. The non-transitory computer readable medium of claim 18 further comprising:

generating scan chain instructions for setting the signal paths during the self-test mode.

\* \* \* \* \*